(12) United States Patent
Sano

(10) Patent No.: US 9,422,117 B2
(45) Date of Patent: Aug. 23, 2016

(54) CHIP FEEDER

(71) Applicant: Murata Manufacturing Co., Ltd., Nagaokakyo-shi, Kyoto-fu (JP)

(72) Inventor: Masaharu Sano, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 34 days.

(21) Appl. No.: 14/446,372

(22) Filed: Jul. 30, 2014

(65) Prior Publication Data

US 2015/0056053 A1   Feb. 26, 2015

(30) Foreign Application Priority Data

Aug. 20, 2013 (JP) ................................. 2013-170084
May 15, 2014 (JP) ................................. 2014-101233

(51) Int. Cl.
*B65G 47/14* (2006.01)
*H05K 13/02* (2006.01)

(52) U.S. Cl.
CPC .............. *B65G 47/14* (2013.01); *H05K 13/021* (2013.01); *H05K 13/028* (2013.01)

(58) Field of Classification Search
CPC ........ H01G 13/00; B65G 27/16; B65G 27/22; B65G 27/24; B65G 27/26; B65G 47/14; B65G 47/1421; H05K 13/021; H05K 13/028
USPC ................ 414/755; 198/391, 752.1; 209/397; 29/743, 821
See application file for complete search history.

(56) References Cited

U.S. PATENT DOCUMENTS

| 3,667,103 | A | * | 6/1972 | Petree | 29/737 |
| 3,704,504 | A | * | 12/1972 | Koegler | 29/821 |
| 3,736,651 | A | * | 6/1973 | Law et al. | 29/428 |
| 3,808,681 | A |   | 5/1974 | Law et al. | |
| 4,089,105 | A | * | 5/1978 | Yeo et al. | 29/844 |
| 4,395,184 | A | * | 7/1983 | Braden | 414/17 |
| 4,960,195 | A | * | 10/1990 | Yamaguchi et al. | 193/44 |
| 5,205,395 | A | * | 4/1993 | Bruno et al. | 198/389 |
| 5,337,893 | A | * | 8/1994 | Nami et al. | 206/722 |

(Continued)

FOREIGN PATENT DOCUMENTS

| JP | 5-226201 A | 9/1993 |
| JP | 8-11808 A | 1/1996 |

(Continued)

OTHER PUBLICATIONS

Official Communication issued in corresponding Korean Patent Application No. 10-2016-0032726, mailed on Apr. 15, 2016.

*Primary Examiner* — Dean Kramer
(74) *Attorney, Agent, or Firm* — Keating & Bennett, LLP

(57) ABSTRACT

A chip feeder includes a feed pallet in which accommodating portions, in which chips are to be accommodated, are provided, a suction unit configured to perform suction through the accommodating portions, a vibration application unit configured to apply vibration to the feed pallet, a control unit that is configured and programmed to periodically switch between a state where the suction is being performed and a state where the suction is not performed in a state where the chips have been supplied on the feed pallet, and where the vibration has been applied to the feed pallet. The chips supplied on the feed pallet are to be fed into the accommodating portions by the vibration and the suction. The suction is performed at least once during one period of the vibration.

15 Claims, 13 Drawing Sheets

(56) References Cited

U.S. PATENT DOCUMENTS 7,743,913 B2* 6/2010 Ikeda .................. 198/689.1
2012/0120547 A1 5/2012 Ro et al.

FOREIGN PATENT DOCUMENTS

JP 2011-49373 A 3/2011
KR 10-2012-0052818 A 5/2012

* cited by examiner

CHIP FEEDER

BACKGROUND OF THE INVENTION

1. Field of the Invention

The present invention relates to chip feeders, and more particularly to a chip feeder that is used in a process of manufacturing an electronic component such as a chip monolithic ceramic capacitor or a chip inductor or the like.

2. Description of the Related Art

An alignment apparatus (a vibrating parts aligner) that will be described below has been proposed as an example of an alignment apparatus that is used for aligning chips such as electronic components or electronic component elements that are formed in a process of manufacturing such electronic components (see Japanese Unexamined Patent Application Publication No. 8-11808, for example).

The alignment apparatus (the vibrating parts aligner) includes (a) an alignment pallet in which a plurality of component accommodating holes that are to be fed with components are formed, (b) component collection pallets that cause a desired component to slide down onto the alignment pallet and collect a desired component, (c) a vibration table that supports the alignment pallet and the component collection pallets, (d) a vibration device that is used for applying a reciprocating vibration along a surface of the vibration table to the vibration table, (e) an oscillation shaft that is fixed to the vibration table and that functions as a rotary shaft that causes the table to rotate in such a manner that the surface of the table is inclined at a predetermined angle, (f) an oscillation driving source that is used for driving the oscillation shaft so as to rotate, (g) an angle detection unit that detects the angle at which the vibration table oscillates as a result of a rotation of the oscillation shaft, and (h) a control unit that controls the operations of the oscillation driving source and the vibration device on the basis of a value that is detected by the angle detection unit. The front surface of the vibration table, which is fixed to the oscillation shaft, can be made to stand upright or can be reversed. The vibrating parts aligner further includes a component holding device that holds the components that have been aligned and accommodated in the component accommodating holes of the alignment pallet both when the vibration table is made to stand upright and when the vibration table is reversed. One of the component collection pallets includes a roof that has a substantially inverted U-shaped cross section and in which a component, which is to be collected, is to be accommodated when the vibration table is reversed. In addition, Japanese Unexamined Patent Application Publication No. 8-11808 discloses a configuration in which a suction device that draws in components to be aligned through the component accommodating holes of the above-described alignment pallet toward the rear surface of the above-described vibration table is provided as the above-described component holding device.

According to the alignment apparatus (the vibrating parts aligner), a component that remains on the alignment pallet can be effectively collected by causing the remaining component to fall into a component collection pallet, and the time taken for aligning components and the time taken for collecting such a remaining component can be significantly reduced. In addition, maintenance of the aligned state of the aligned components in a state where the vibration table is reversed can be controlled, and thus, automatic transportation of the aligned components can be easily performed by disposing an automatic transportation machine beneath the vibrating parts aligner.

Japanese Unexamined Patent Application Publication No. 8-11808 describes that components that are positioned in the vicinity of the component accommodating holes of the alignment pallet may be fed into the component accommodating holes by performing vacuum suction through the component accommodating holes in such a manner as to generate a force that draws the components into the component accommodating holes. In this case, for example, as schematically illustrated in FIG. 12, a component 101 that has been moved to the vicinity of a component accommodating hole 102, which is formed in an alignment pallet 103, by the effects of vibration and oscillation is drawn and fed into the component accommodating hole 102 by the effect of suction.

However, for example, as illustrated in FIG. 13, when the vacuum suction is enabled, the component 101 that is present on the alignment pallet 103 in a state of blocking the component accommodating hole 102 of the alignment pallet 103 is held so as to keep the state and fixed onto the component accommodating hole 102 by the vacuum suction, and thus, the component 101 will not be fed into the component accommodating hole 102 during the period when the vacuum suction is enabled.

In addition, the components, which have been held so as to cover the component accommodating holes, are obstacles to the movements of other components on the alignment pallet, so that, although the probability of the other components being fed into the component accommodating holes is high at the beginning of the suction, no components will be fed into the component accommodating holes that are blocked by other components. Thus, even if the period of time in which the vacuum suction is being enabled is extended, the probability of components being fed into component accommodating holes cannot be improved, and on the contrary, there is a problem that the probability is reduced.

SUMMARY OF THE INVENTION

Accordingly, preferred embodiments of the present invention provide a chip feeder capable of efficiently feeding chips such as electronic components or electronic component elements that are formed in a process of manufacturing such electronic components into accommodating portions that are formed in a feed pallet.

According to a preferred embodiment of the present invention, a chip feeder includes a feed pallet in which an accommodating portion, in which a chip is to be accommodated, is provided, a suction unit configured to perform suction through the accommodating portion and help the chip to be fed into the accommodating portion, a vibration application unit configured to apply vibration to the feed pallet, and a control unit configured and configured to periodically switch between a state where suction is being performed by the suction unit through the accommodating portion and a state where suction is not performed in a state where the chip has been supplied on the feed pallet, and where vibration has been applied to the feed pallet by the vibration application unit. The chip, which has been supplied on the feed pallet, is to be fed into the accommodating portion by vibration that is applied to the feed pallet by the vibration application unit and suction that is performed by the suction unit through the accommodating portion.

In the chip feeder according to a preferred embodiment of the present invention, it is preferable that, during one period of the vibration, which is applied to the feed pallet by the vibration application unit, the suction, which is performed by the suction unit through the accommodating portion, be started at least once, and the suction be stopped at least once.

The suction, which is performed by the suction unit through the accommodating portion, preferably is started at least once, and the suction is stopped at least once during one period of the vibration, which is applied to the feed pallet, so that an efficient feed operation is performed, and productivity is improved.

In the chip feeder according to a preferred embodiment of the present invention, it is preferable that a negative pressure in the accommodating portion that is generated by the suction reach a maximum range when an amplitude is maximum, and that the negative pressure reach a minimum range when the amplitude is minimum.

The negative pressure reaches a maximum range when the amplitude is maximum, and the negative pressure reaches a minimum range when the amplitude is minimum, so that the efficiency of a feed operation that is obtained by a combination of the advantageous effects of vibration and oscillation is improved, and preferred embodiments of the present invention are efficiently carried out. In addition, since the period of time in which suction is being enabled will not be unnecessarily extended by being synchronized with a vibration period, an efficient feed operation is capable of being performed, and productivity can be improved. Here, the maximum range of the negative pressure refers to a range in which the negative pressure (the degree of vacuum) becomes steady or substantially steady while being high by performing suction, and the minimum range of the negative pressure refers to a range in which the negative pressure (the degree of vacuum) becomes steady or substantially steady while being low by performing suction.

It is preferable that the chip feeder according to a preferred embodiment of the present invention further include a sensor that detects the amplitude, and it is preferable that the magnitude of the amplitude be measured by the sensor, and that the suction unit be caused to operate at a timing at which the negative pressure reaches a maximum range when the amplitude is maximum.

The magnitude of the amplitude is measured by the sensor, and the suction unit is caused to operate when the amplitude is maximum, so that the advantageous effects of vibration and oscillation are combined with each other at an appropriate timing, and the efficiency of a chip feed operation is improved with certainty.

It is preferable that the chip has a rectangular or substantially rectangular parallelepiped shape and is configured to be accommodated in the accommodating portion while a WT surface that is a surface defined by, when a thickness, a width, a length of the chip are T, W, and L, respectively, the thickness T and the width W is facing upward. It is preferable that a suction port be provided on a bottom surface of the accommodating portion, and that an opening area of the suction port be set to be about 1% to about 30% of an area of the WT surface, for example.

As described above, the chip is to be accommodated in the accommodating portion while the WT surface is facing upward, and the opening area of the suction port, which is located on the bottom surface of the accommodating portion, is preferably about 1% to about 30% of the area of the WT surface, for example, so that suction is efficiently performed while energy for suction is maintained in an appropriate range, and thus, preferred embodiments of the present invention are efficiently carried out.

Note that in the case where the opening area of the suction port falls below about 1% of the area of the WT surface, it becomes difficult to obtain a sufficient suction force, and in the case where the opening area of the suction port exceeds about 30% of the area of the WT surface, air leakage from the periphery of the chip occurs, and as a result, the effect of suction becomes insufficient.

It is preferable that the thickness T, the width W, and the length L of the chip have a relationship of L>W>T.

In the case where the chip satisfies a relationship of L>W>T, since the thickness T is smaller than the width W, that is, the chip is thin, it is often not easy to feed the chip in an upstanding posture. However, according to various preferred embodiments of the present invention, the chip is efficiently fed in an upstanding posture, and thus, various preferred embodiments of the present invention are particularly useful.

In addition, the chip, which preferably has a rectangular or substantially rectangular parallelepiped shape, is fed into the accommodating portion while the WT surface of the chip, which has the smallest area, is facing upward, so that the number of chips that are to be fed per planar area of the feed pallet increases, and productivity is improved.

It is preferable that the chip feeder according to a preferred embodiment of the present invention further include an oscillation unit configured to cause the feed pallet to oscillate.

In the case where the chip feeder according to a preferred embodiment of the present invention includes the oscillation unit that causes the feed pallet to oscillate, the movement of the chip on a surface of the feed pallet is facilitated, and the efficiency of a feed operation is further improved.

In the chip feeder according to various preferred embodiments of the present invention, in a state where chips have been supplied on a feed pallet, suction is intermittently performed by a suction unit through accommodating portions while vibration is applied to the feed pallet by a vibration application unit, so that the chips are fed into the accommodating portions that are formed in a predetermined manner. Therefore, the chips are efficiently accommodated in the accommodating portions of the feed pallet by sufficiently utilizing the effects of vibration and oscillation, and the efficiency of a feed operation is improved.

In other words, according to various preferred embodiments of the present invention, since feeding of the chips into the accommodating portions is facilitated by applying vibration to the feed pallet and performing suction through the accommodating portions, a reduction in the time required for a chip feed operation is facilitated. In addition, in the case where a direction in which the chips are to be accommodated has a trend, insertion of the chips into the accommodating portions is facilitated.

An ON state of suction (a state where suction is being performed) and an OFF state of suction (a state where suction is not performed) are periodically switched therebetween. Thus, when suction is in the ON state, feeding of the chips into the accommodating portions is facilitated, and when suction is in the OFF state, the chips on the feed pallet are released from a state of being held on the feed pallet by the suction. The chips move along a surface of the feed pallet by an inertial force that is applied to the chips by vibration. As a result, in the case where there are chips that are sucked and held on the feed pallet in a state of blocking openings of the accommodating portions, such chips are released from a state of being restrained by the suction and are displaced by vibration in such a manner as to move to positions at which the chips are fed into the accommodating portions, and the probability of the chips being fed into the accommodating portions is significantly improved.

By performing an operation for switching between the ON state and the OFF state of suction at high speed, the time required for feeding of the chips into the accommodating portions is significantly reduced, and productivity is greatly improved.

Note that, in the case of intermittently performing suction, an inertial force that is to be applied to the chips that are positioned above the accommodating portions in a state of blocking the accommodating portions when suction is disabled is maximized by disabling suction in an acceleration/deceleration range of vibration, and the chips that are present at positions at which the chips block the openings of the accommodating portions are moved from the positions. Therefore, by performing an operation to periodically switch between the ON state and the OFF state of suction the time required for a feed operation is further reduced, and productivity can be improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The features of the present invention will be described in further detail below by describing preferred embodiments of the present invention.

First Preferred Embodiment

Figure 1:
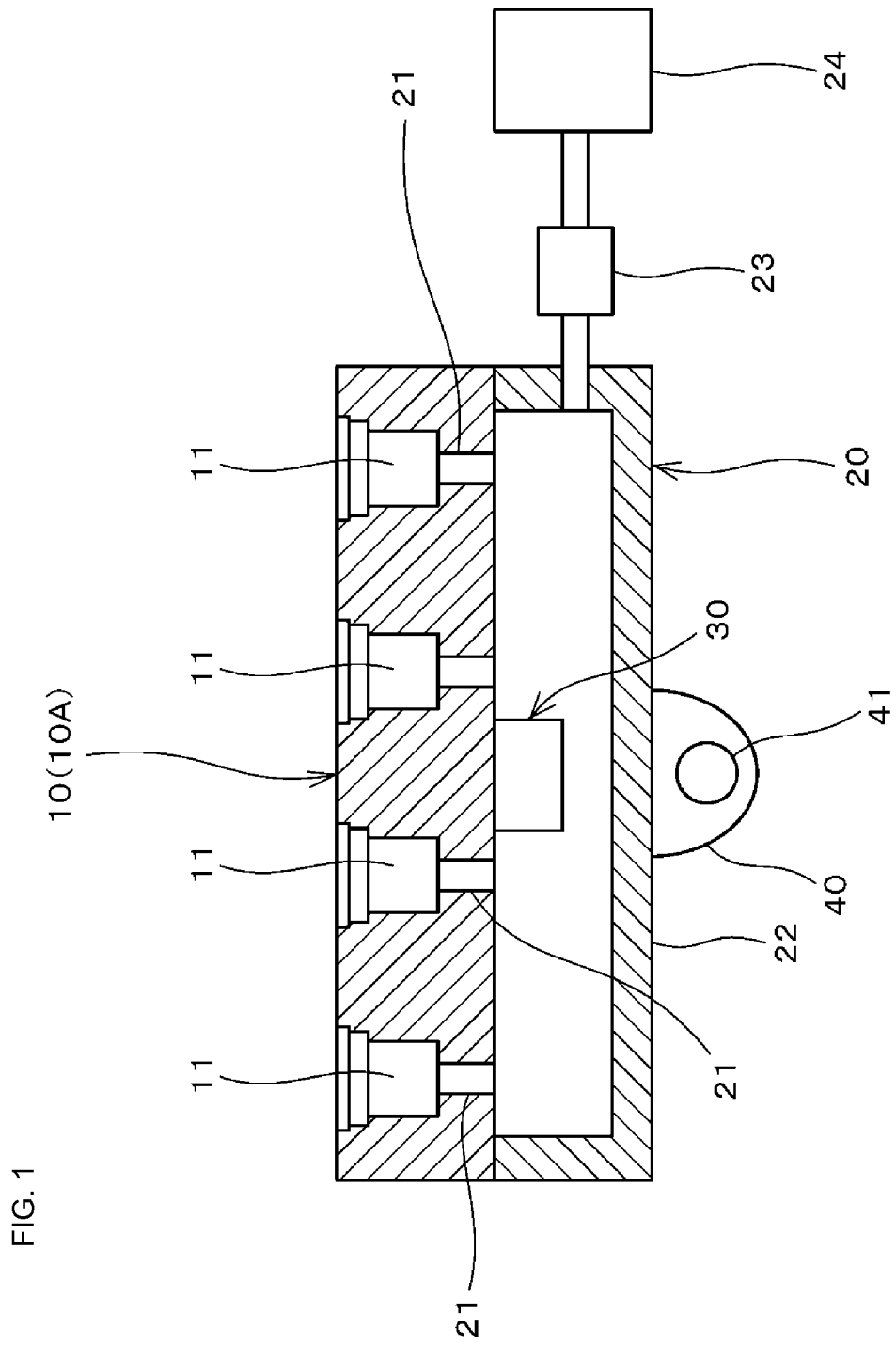
FIG. 1 is a sectional front view illustrating the configuration of a feeder according to a first preferred embodiment of the present invention.
Figure 2:
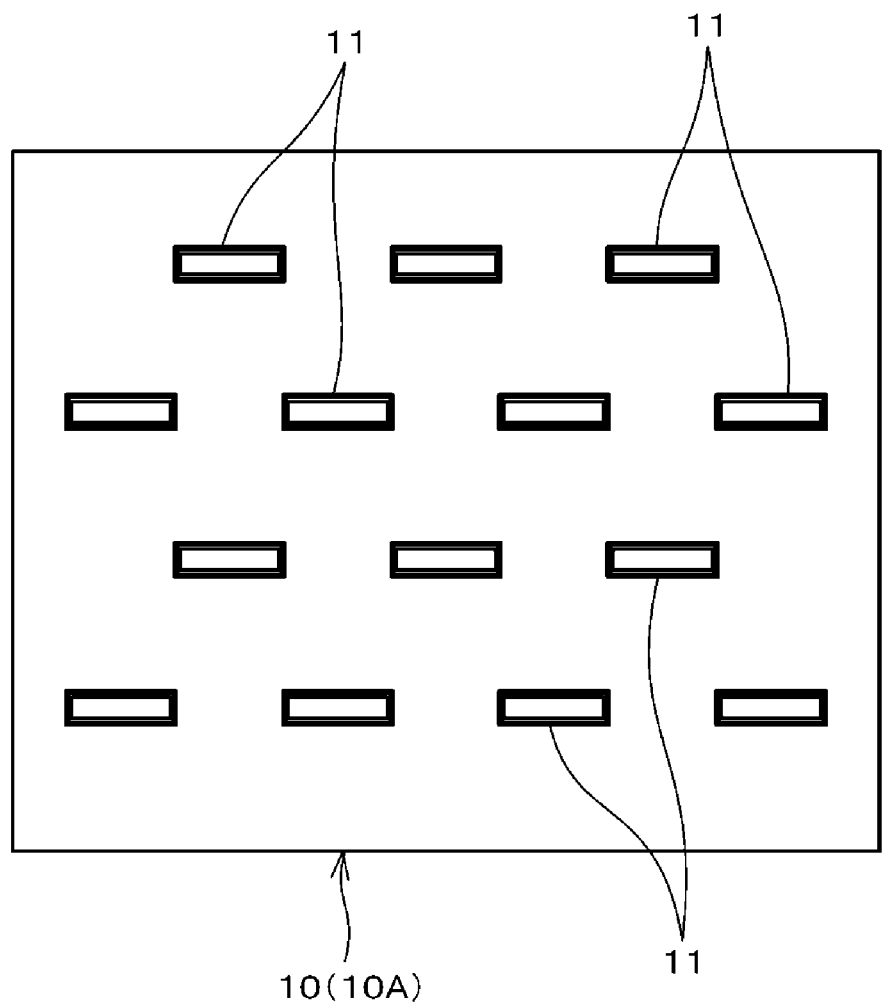
FIG. 2 is a plan view of a feed pallet that is included in the feeder according to the first preferred embodiment of the present invention.
Figure 3:
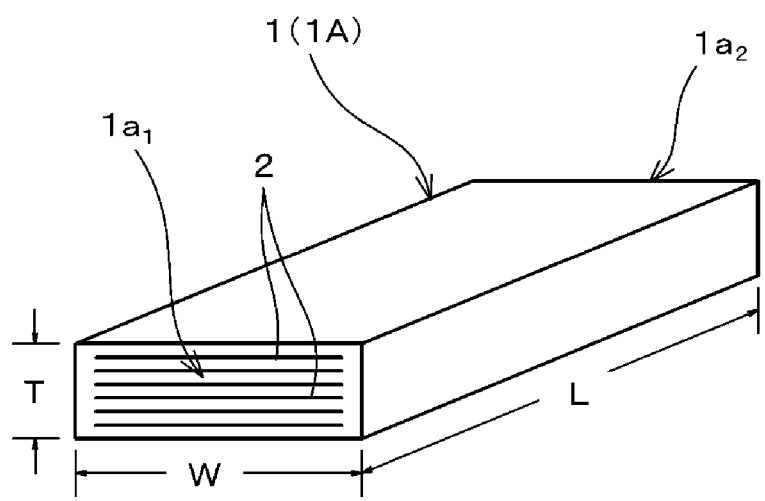
FIG. 3 is a perspective view illustrating the configuration of one of chips that are to be subjected to a feed operation using the feeder according to the first preferred embodiment of the present invention.

FIG. 1 is a sectional front view illustrating the configuration of a chip feeder according to a first preferred embodiment of the present invention. FIG. 2 is a plan view of a feed pallet that is included in the chip feeder. FIG. 3 is a perspective view illustrating the configuration of one of chips.

In the first preferred embodiment, chips 1 that are to be subjected to a feed operation that is performed by using the chip feeder, which is illustrated in FIG. 1, preferably are ceramic multilayer bodies (monolithic ceramic capacitor elements) that are formed in a process of manufacturing monolithic ceramic capacitors, and as illustrated in FIG. 3, each of the chips 1 has a configuration in which inner electrodes 2 that are adjacent to one another in a stacking direction are alternately drawn out toward one of end surfaces (WT surfaces) $1a_1$ and $1a_2$ that oppose each other. In addition, in each of the chips 1, a pair of outer electrodes will be formed on the end surfaces in such a manner as to be electrically connected to the inner electrodes 2, which are drawn out toward one of the opposing end surfaces ($1a_1$, $1a_2$).

Note that, in the first preferred embodiment, each of the chips 1, which are to be subjected to a feed operation, preferably has dimensions (thickness T×width W×length L) of, for example, about 0.15 mm×about 0.5 mm×about 1.0 mm.

In the first preferred embodiment, the chips 1 are to be fed into accommodating portions 11 (described later), which are formed in a surface of a feed pallet 10 of the chip feeder by being recessed, in such a manner that the top end portions of the chips 1 project from the accommodating portions 11. Note that the chips 1 are to be fed in such a manner that the top end portions of the chips 1 project from the accommodating portions 11, so that, as will be described later, an adhesive member 51 that is a substantially sheet-shaped member, which has a viscosity, and that is included in an adhesive holding jig 50 is made to hold the chips 1 by pressing the adhesive holding jig 50 against the chips 1 from the side on which the top surface of the feed pallet 10 is present (see FIGS. 5 to 8).

As illustrated in FIG. 1, the chip feeder according to the first preferred embodiment includes the feed pallet 10 that has a flat or substantially flat plate-shaped configuration and in which the accommodating portions 11, in which the chips 1 are to be accommodated, are provided and a suction unit 20 that is configured to generate a negative pressure in the accommodating portions 11 at a predetermined timing by intermittently performing suction through the accommodating portions 11. In addition, the chip feeder includes a vibration application unit 30 that is configured to apply vibration that has a predetermined vibration period and a predetermined amplitude to the feed pallet 10 and an oscillation unit 40 that is configured to cause the feed pallet 10 to oscillate at the same time as the vibration is applied by the vibration application unit 30.

In the chip feeder of the first preferred embodiment, the timing of generating a predetermined negative pressure in the accommodating portions 11 by the suction that is performed by the suction unit 20 and the timing of applying the vibration, which has a predetermined amplitude, to the feed pallet 10 by the vibration application unit 30 preferably are set to be synchronized with each other.

The first preferred embodiment will be described in further detail below.

In the chip feeder of the first preferred embodiment, a large number of accommodating portions 11 that are to be fed with the chips 1 one by one in a posture in which the WT surfaces, each of which is defined by the width W and the thickness T, define and serve as the top surface and the bottom surface and in which the chips 1 are to be held in a state where the top end portions of the chips 1 project from the accommodating portions 11 (a state where head portions of the chips 1 are exposed) are formed in the feed pallet 10.

The shape of each of the accommodating portions 11 when viewed in plan preferably is a rectangular or substantially rectangular shape that is slightly larger than one of the WT surfaces of one of the chips 1 in order to allow the chips 1 to be accommodated in the accommodating portions 11 in a posture in which the WT surfaces serve as the top and bottom surfaces. The depth D (FIG. 5) of each of the accommodating portions 11 preferably is smaller than the length L of one of the chips 1 by about 0.05 mm to about 0.3 mm, for example.

In addition, suction ports 21 that allow suction are arranged on the bottom surfaces of the accommodating portions 11. The planar area of each of the suction ports 21 preferably is about 1% to about 30% (preferably about 12% in the first preferred embodiment) of the area of one of the WT surfaces, which is defined by the width W and the thickness T, of one of the chips 1, for example. This is because, in the case where the opening area of each of the suction ports 21 falls below about 1% of the area of the WT surface, it becomes difficult to obtain a sufficient suction force, and in the case where the opening area of each of the suction ports 21 exceeds about 30% of the area of the WT surface, air leakage from the periphery of the chips 1 occurs, and as a result, the effect of sucking the chips 1 with certainty becomes insufficient.

The feed pallet 10 preferably is a plate-shaped or substantially plate-shaped member that is made of a resin material or a metal material, for example. The entire feed pallet 10 may be integrally formed, or the feed pallet 10 may be formed by stacking a plurality of metallic sheets, each of which has a portion that has been etched so as to serve as one of the accommodating portions 11, on top of one another.

A surface of the feed pallet 10 has undergone sandblasting in such a manner as to roughen the surface and reduce friction that will be generated between the surface and the chips 1, so that the chips 1 easily move along the surface of the feed pallet 10 by vibration and oscillation that are to be applied during a feed operation, and as a result, the feed operation is efficiently performed.

A step configured to help the chips 1 to be fed is provided in the vicinity of an upper opening of each of the accommodating portions 11.

A suction unit that includes a suction chamber (a vacuum chamber) 22 (FIG. 1) that is disposed on the side of the bottom surface of the feed pallet 10, an ON/OFF valve (an opening and closing valve) 23, and a vacuum source (a suction source) 24 (e.g., a vacuum pump) is preferably used as the suction unit 20, which is used to generate a negative pressure in the accommodating portions 11 of the feed pallet 10 at a predetermined timing. Note that in order to reduce the time taken for an actual suction pressure within the accommodating portions 11 to respond to an operation for switching between an ON state and an OFF state of suction, it is desirable that the distance between the suction chamber 22 and the ON/OFF valve 23 be set as small as possible.

Although the specific configuration of the vibration application unit 30 is not particularly illustrated in the drawings, in the first preferred embodiment, for example, a vibration application unit that applies a predetermined vibration to the feed pallet 10 by connecting a cam to a rotary shaft that is to be caused to rotate by a motor and causing the rotary shaft to rotate at a predetermined rotation speed is preferably used as the vibration application unit 30. Although the direction of the vibration is parallel or substantially parallel to the surface of the feed pallet 10, the direction of the vibration may be perpendicular or substantially perpendicular to the surface of the feed pallet 10 or may be parallel or substantially parallel and perpendicular or substantially perpendicular to the surface of the feed pallet 10.

The oscillation unit 40 includes an oscillation shaft 41 that is configured to cause the surface of the feed pallet 10 to be inclined at a predetermined angle and an oscillation driving source (e.g., a motor) (not illustrated) that is configured to drive the oscillation shaft 41 so as to rotate. Note that, in the chip feeder of the first preferred embodiment, the feed pallet 10 is caused to oscillate at a predetermined pitch by the oscillation unit 40 in such a manner that the surface of the feed pallet 10 is inclined at about 60 degrees in a predetermined direction and about 15 degrees in a direction opposite to the predetermined direction, for example.

In addition, the chip feeder of the first preferred embodiment includes a position detection sensor configured to detect an amplitude position in a vibrating motion, and output of the position detection sensor and switching of the ON/OFF states of suction configured to synchronously controlled.

In the case where a vibrating motion is applied by the cam that is connected to the rotary shaft, which is caused to rotate by a motor, detection of an amplitude position in the vibrating motion is performed by, for example, mounting a slit plate on the rotary shaft, matching a slit of the slit plate with a predetermined position of the vibrating motion, and detecting the position by a transmission sensor or the like.

The synchronous control is performed by performing switching of the ON/OFF states of suction on the basis of a signal from the position detection sensor, that is, performing switching of the ON/OFF states of suction in such a manner that the switching interlocks with the vibrating motion. A switching period of the ON/OFF states of suction and a vibration period are not necessarily synchronized with each other so as to exactly have a length relationship of 1:1. For example, the switching period of the ON/OFF states of suction and the vibration period may be synchronized with each other so as to have a length relationship of 1:2, 2:1, or the like.

Although an amplitude position in a vibrating motion is accurately detected by using such a method of mounting a sensor on the rotary shaft, detection of an amplitude position in a vibrating motion may be performed by using other methods or configurations. For example, detection of an amplitude position in a vibrating motion may be performed by putting a mark on the feed pallet 10 and mounting a sensor that detects the position of the mark.

In addition, the synchronous control preferably is performed by using a simple method such as setting a vibration period and a switching period of the ON/OFF states of suction to be a fixed period. For example, by setting the rotational speed of the rotary shaft, to which the cam has been connected, to about 600 rpm, that is, by setting a vibration period and a switching period of the ON/OFF states of suction to about 0.1 seconds and about 0.05 seconds, respectively, switching to the ON state of suction and switching to the OFF state of suction are each performed twice during a single vibration, for example.

Here, note that the term "synchronous" is used in the meaning of matching in terms of time, that is, allowing to have a fixed relationship.

The term "interlock" is used in relation to a phenomenon in which when one part is caused to move, a device that is connected to the part operates along with the movement of the part, that is, a phenomenon in which one part moves by being influenced by the movement of another part.

Non-limiting examples of a method of feeding chips by using the above-described chip feeder and a method of applying a conductive paste that allows formation of outer electrodes to the chips that have been fed will now be described with reference to FIGS. 4 to 9, which are schematic diagrams.

(1) The feed pallet 10 is arranged onto the suction ports 21, and the chips 1 are supplied in a scattered manner onto the feed pallet 10.

(2) Vibration and oscillation are applied to the feed pallet 10 by the vibration application unit 30 and the oscillation unit 40 in such a manner as to cause the chips 1 on the feed pallet 10 to move.

(3) An intermediate position of a vibrating motion is detected by the position detection sensor at the same time as the above-described operation of (2), and suction is started in response to a detection signal from the position detection sensor. Performing suction facilitates feeding of the chips 1 that are positioned in the vicinity of the accommodating portions 11 into the accommodating portions 11, and the probability of the chips 1 being fed becomes higher. In addition, the chips 1 that are not positioned in the vicinity of the accommodating portions 11 are also caused to move along the surface of the feed pallet 10 by the above-described vibration and oscillation operations of (2), and when the chips 1 are close to the accommodating portions 11, the probability of the chips 1 being drawn and fed into the accommodating portions 11 by a suction force through the accommodating portions 11 becomes higher.

Note that as the length of time for performing suction increases, the number of the chips 1 that are held on the surface of the feed pallet 10 and stay thereon in a state of blocking openings of the accommodating portions 11 increases. Therefore, it is necessary to allow (release) the chips 1, which have stayed on the surface of the feed pallet 10 in a state of blocking the openings of the accommodating portions 11, to move along the surface of the feed pallet 10 by stopping the suction.

However, in order to facilitate the movements of the chips 1 along the surface of the feed pallet 10, it is preferable to stop the suction in an acceleration/deceleration range of vibration in which an inertial force is applied to the chips 1 and it is preferable to realize a state where the actual suction pressure within the accommodating portions 11 is not a negative pressure.

In other words, it is preferable that the accommodating portions 11 be released at atmospheric pressure in the OFF state of suction.

In the first preferred embodiment, the length of time over which suction is in the ON state preferably is set by setting a timing of enabling suction (starting suction) and a timing of disabling the suction (stopping the suction) so as to interlock with a vibrating motion with consideration of a response time delay.

In the first preferred embodiment, the length of time over which suction is in the ON state preferably is set in view of the foregoing, and regarding the length of time over which suction is in the OFF state, setting of a timing of enabling suction (starting suction) and a timing of disabling the suction (stopping the suction) and setting of the length of time over which suction is in the OFF state are performed in such a manner that a state where the actual suction pressure within the accommodating portions 11 is not a negative pressure in an acceleration/deceleration range of vibration is realized.

In other words, in various preferred embodiments of the present invention, the duration of each of the ON state and the OFF state of suction and the conditions regarding a switching period of the ON/OFF states of suction preferably are set in view of the foregoing.

Figure 4:
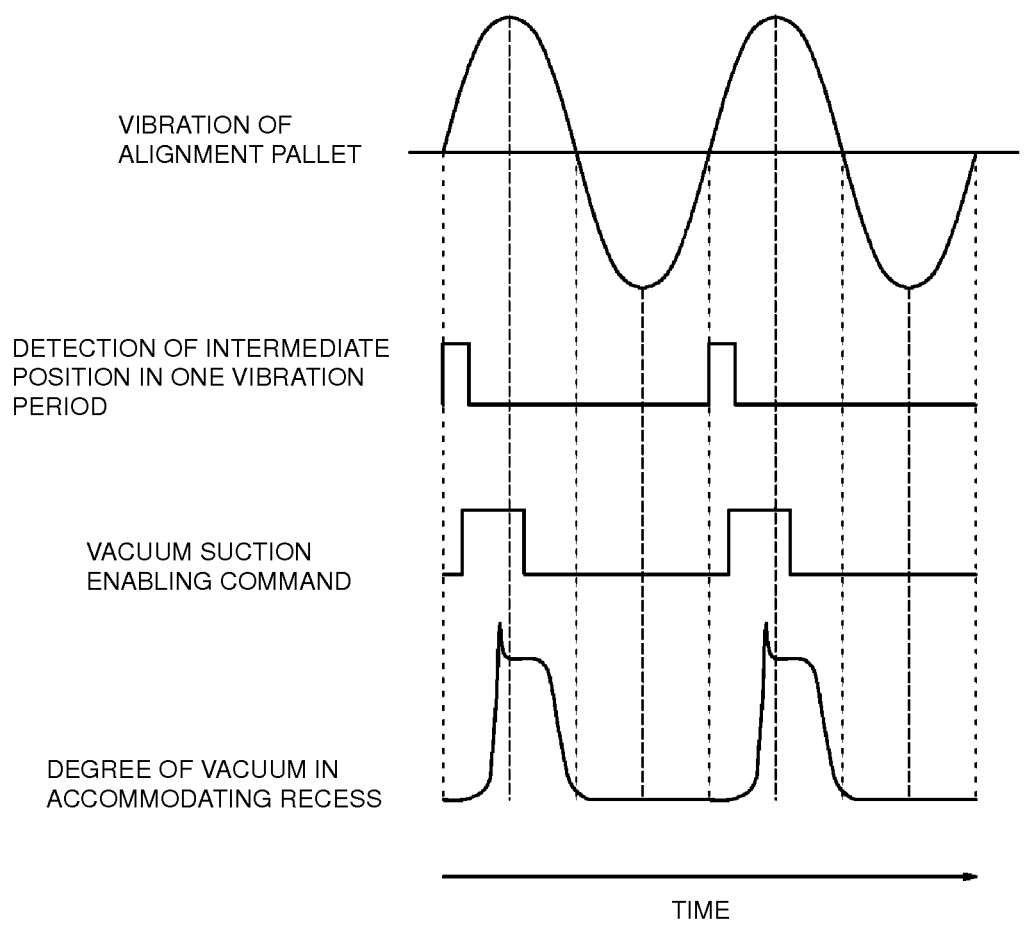
FIG. 4 is a graph showing variations in vibration and suction when a chip feed operation is performed by using the feeder according to the first preferred embodiment of the present invention.

FIG. 4 is a graph showing timings of vibration, suction, and the like. As illustrated in FIG. 4, in the first preferred embodiment, in order to cause a negative pressure that is generated by suction to reach the maximum range when the amplitude of vibration is maximum, a stroke intermediate position of vibration that is to be applied by the vibration application unit 30 is detected, and setting for issuing a command to enable suction upon detection of the stroke intermediate position is performed with consideration of a response delay of the actual pressure within the accommodating portions 11 to the command to enable suction. In addition, in order to cause the negative pressure to reach the minimum range when the amplitude of vibration, at which the inertial forces of the chips 1 become maximum, is minimum, setting for issuing a command to disable suction is performed with consideration of a response delay of the actual pressure within the accommodating portions 11 to the command to disable suction.

More specifically, in a feed operation for the chips 1, vibration is applied under a condition of the rotational speed of the rotary shaft, to which the cam has been connected, of about 600 rpm, and suction is preferably performed under the following conditions: the negative pressure that is generated by the suction reaches the maximum range when the amplitude of the vibration is maximum, and the length of time over which the suction is in the ON state and the length of time over which suction is in the OFF state are, for example, about 0.025 seconds and about 0.05 seconds, respectively.

Note that the maximum range of the negative pressure refers to a range in which the negative pressure (the degree of vacuum) becomes steady or substantially steady while being high by performing suction, and the minimum range of the negative pressure refers to a range in which the negative pressure (the degree of vacuum) becomes steady or substantially steady while being low by performing suction.

Figure 5:
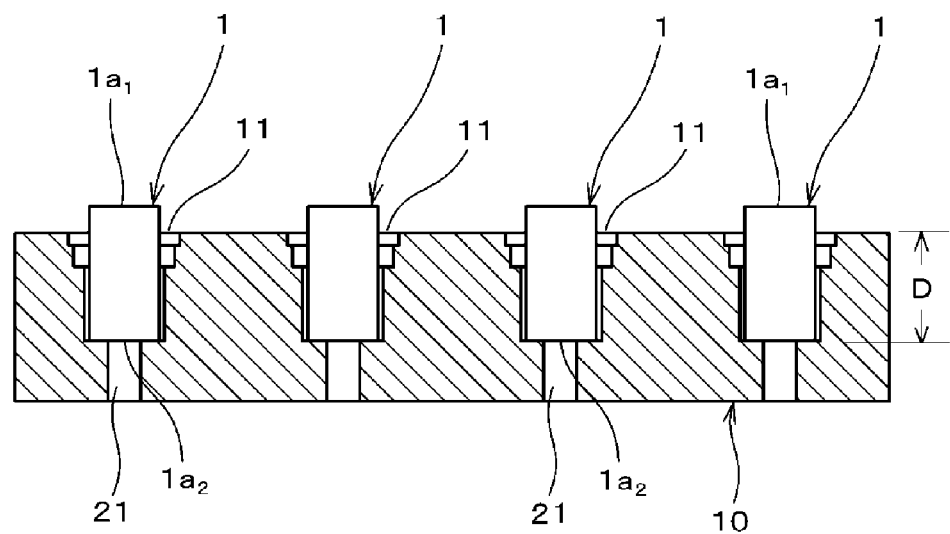
FIG. 5 is a diagram illustrating a state where chips have been fed in accommodating portions by using the feeder according to the first preferred embodiment of the present invention.

(4) The chips 1 are fed into the accommodating portions 11 of the feed pallet 10 as illustrated in FIG. 5 by performing the above-described operations of (2) and (3) for a certain time. After that, the applications of vibration and oscillation are stopped.

Note that, as described above, the thickness T of each of the chips 1 that are to be subjected to a feed operation in the first preferred embodiment preferably is about 0.15 mm, for example, which is thin, and the shape of each of the accommodating portions 11, which have been formed in the feed pallet 10, when viewed in plan preferably is a rectangular or substantially rectangular shape corresponding to the shape of one of the WT surfaces of one of the chips 1. Since the dimensions of the accommodating portions 11 on the short sides thereof are small, the probability of the accommodating portions 11 being blocked by the chips 1 becomes higher, and thus, it is not easy to efficiently feed the chips 1 into the accommodating portions 11. However, it was confirmed that the filling percentage, which is the percentage of the accommodating portions 11 into which the chips 1 have been fed, exceeded 99% when a feed operation was performed by using the chip feeder of the first preferred embodiment under the above conditions. Note that the filling percentage is a value that is determined by the following equation.

$$\text{Filling Percentage}(\%) = (B/A) \times 100$$

A: The number of accommodating portions provided in a feed pallet

B: The number of accommodating portions into which chips have been fed

Note that, as illustrated in FIG. 5, the chips 1 that have been fed in the accommodating portions 11 are in a state where the top end portions of the chips 1 are exposed at (project from) the accommodating portions 11 and where other portions of the chips 1 are accommodated and held in the accommodating portions 11.

Figure 6:
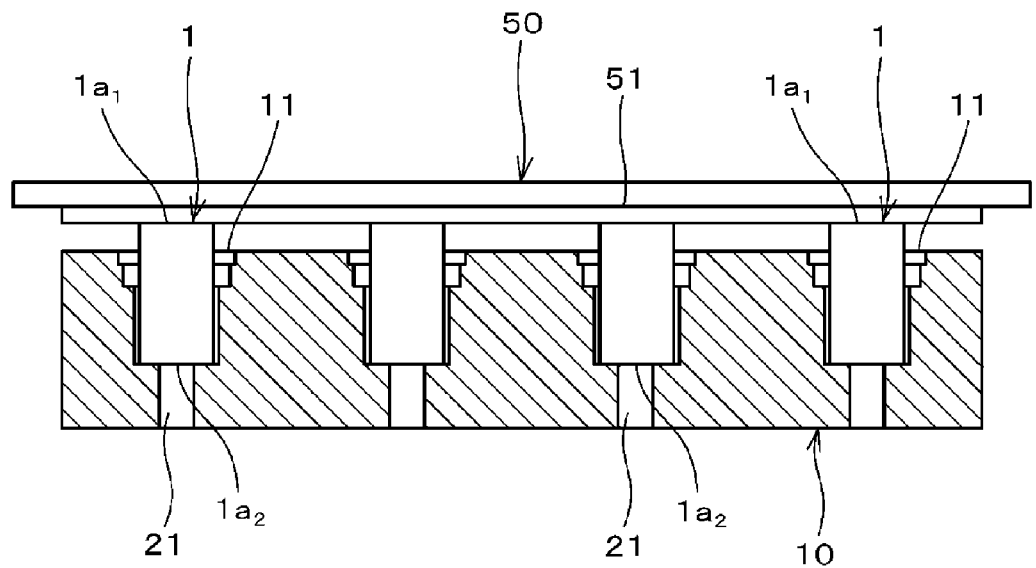
FIG. 6 is a diagram illustrating a process of making an adhesive holding jig adhesively hold the chips, which have been fed by using the feeder according to the first preferred embodiment of the present invention.
Figure 7:
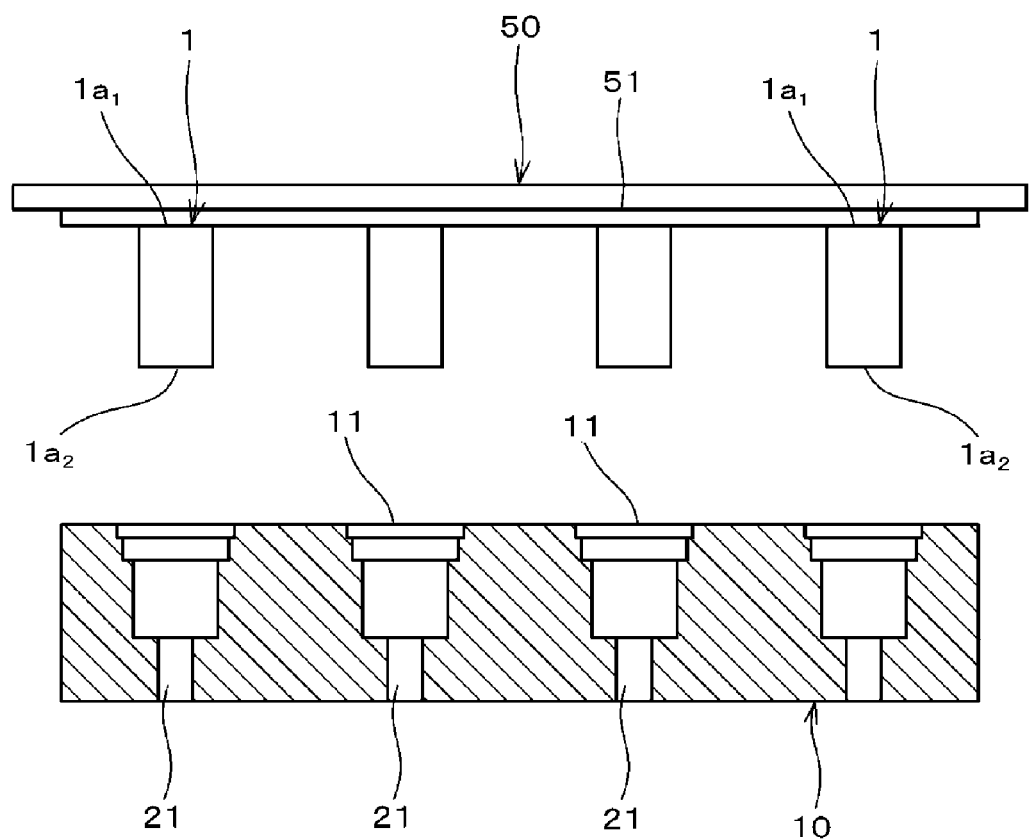
FIG. 7 is a diagram illustrating a state where the chips, which have been fed by using the feeder according to the first preferred embodiment of the present invention, have been transferred to the adhesive holding jig.

(5) Then, as illustrated in FIG. 6, the adhesive holding jig 50 that includes the adhesive member 51, which is a sheet-shaped or substantially sheet-shaped member having a viscosity, is pressed against the WT surfaces $1a_1$ of the chips 1, which are defined by the width W and the thickness T and which are exposed at the accommodating portions 11, from the side on which the top surface of the feed pallet 10 is present so as to cause the chips 1 to be held by the adhesive member 51 of the adhesive holding jig 50, and after that, as illustrated in FIG. 7, the chips 1 are transferred onto the adhesive holding jig 50 by isolating the adhesive holding jig 50 from the feed pallet 10. Note that a sheet-shaped or substantially sheet-shaped adhesive member that has a viscosity strength, which is high enough to hold the chips 1, and elasticity is used as the adhesive member 51. Various members that are capable of adhesively holding the chips 1 preferably are used as the adhesive member 51.

Figure 8:
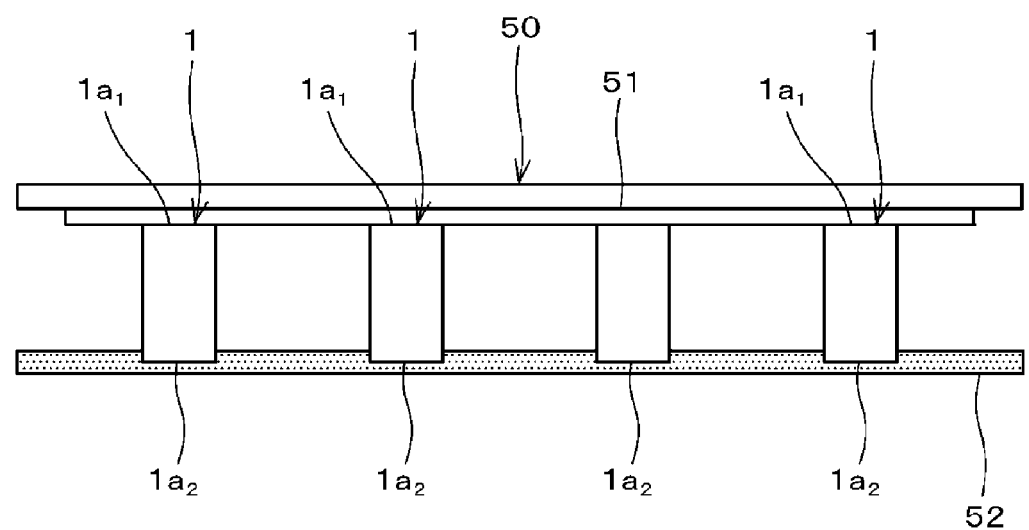
FIG. 8 is a diagram illustrating a state where the chips, which have been transferred to the adhesive holding jig, are being dipped in a conductive paste layer.
Figure 9:
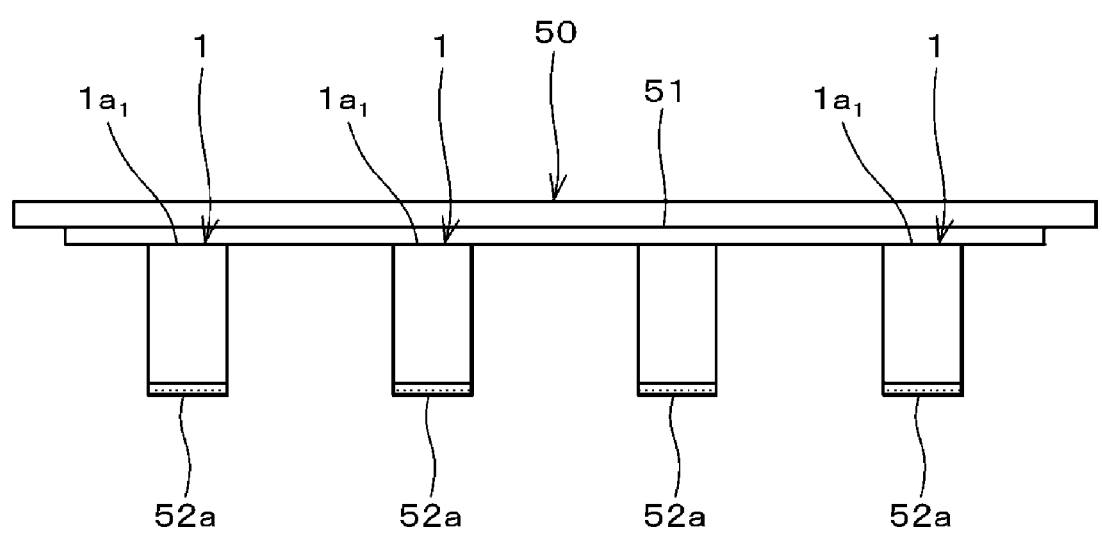
FIG. 9 is a diagram illustrating a state where the chips, which have been transferred to the adhesive holding jig, have been drawn up from the conductive paste layer.

(6) Next, as illustrated in FIG. 8, the WT surfaces $1a2$ of the chips 1, which serve as the bottom surfaces of the chips 1 and which have been held by the adhesive holding jig 50, are dipped into a conductive paste layer 52, and after that, the chips 1 are lifted up, so that, as illustrated in FIG. 9, a conductive paste $52a$ are deposited onto the WT surfaces $1a_2$ and portions of the side surfaces in the vicinity of the WT surfaces $1a_2$ of the chips 1.

(7) Then, the conductive paste $52a$ is dried in a state where the chips 1 are being held by the adhesive holding jig 50.

(8) After that, although not particularly illustrated in the drawings, the chips 1 are transferred onto an adhesive holding jig that includes an adhesive member that has a viscosity higher than that of the adhesive member 51 of the adhesive holding jig 50, which is used in the above-described operation of (5), by making the adhesive holding jig adhesively hold the WT surfaces $1a_2$ of the chips 1, to which the conductive paste $52a$ has been applied. Then, operations that are similar to the above-described operations of (6) and (7) are performed, and the conductive paste $52a$ is deposited onto the WT surfaces $1a_1$, which are opposite to the WT surfaces $1a_2$, and portions of the side surfaces in the vicinity of the WT surfaces $1a_1$ of the chips 1.

(9) Then, the chips 1 are separated from the adhesive holding jig. The conductive paste $52a$ is baked by firing the chips 1 under predetermined conditions. As a result, monolithic ceramic capacitors each of which has a configuration in which outer electrodes that are electrically connected to inner electrode are provided on opposing end surfaces of a chip are obtained.

In the first preferred embodiment, it was confirmed that chips were efficiently fed into accommodating portions of a feed pallet, the time required for a feed operation was reduced, and productivity was improved by synchronously controlling a switching period of the ON/OFF states of suction and a vibration period.

In addition, monolithic ceramic capacitors were efficiently manufactured by using the chip feeder of the first preferred embodiment, for example.

Note that, although the case where the chip feeder includes the oscillation unit 40, which causes the feed pallet 10 to oscillate, has been described as an example in the first preferred embodiment, the chip feeder need not include the oscillation unit 40, and also in this case, the basic advantageous effects of various preferred embodiments of the present invention are obtained.

In addition, in the first preferred embodiment, although suction preferably is performed from the suction ports 21, which are arranged on the bottom surfaces of the accommodating portions 11, in the chip feeder according to various preferred embodiments of the present invention, in the case where suction is intermittently performed by a suction unit through accommodating portions, it is desirable that suction be performed through lower portions or bottom portions of the accommodating portions 11 from the standpoint of further efficiently performing a feed operation.

More specifically, for example, it is desirable that suction be performed from suction ports that are arranged on lower portions of surrounding walls of accommodating portions, and in particular, as in the first preferred embodiment, it is desirable that suction be performed from the suction port 21 that are arranged on the bottom surfaces of the accommodating portions 11. Note that although each of the accommodating portions 11 preferably is provided with one of the suction ports 21 in the first preferred embodiment, each of the accommodating portions 11 can be provided with a plurality of the suction ports 21.

Second Preferred Embodiment

In a second preferred embodiment, two types of chips 1A and 1B each of which has a different thickness are prepared, and feed operations for the chips 1A and 1B are performed by using two types of feed pallets 10A and 10B, which will be described later.

Figure 10:
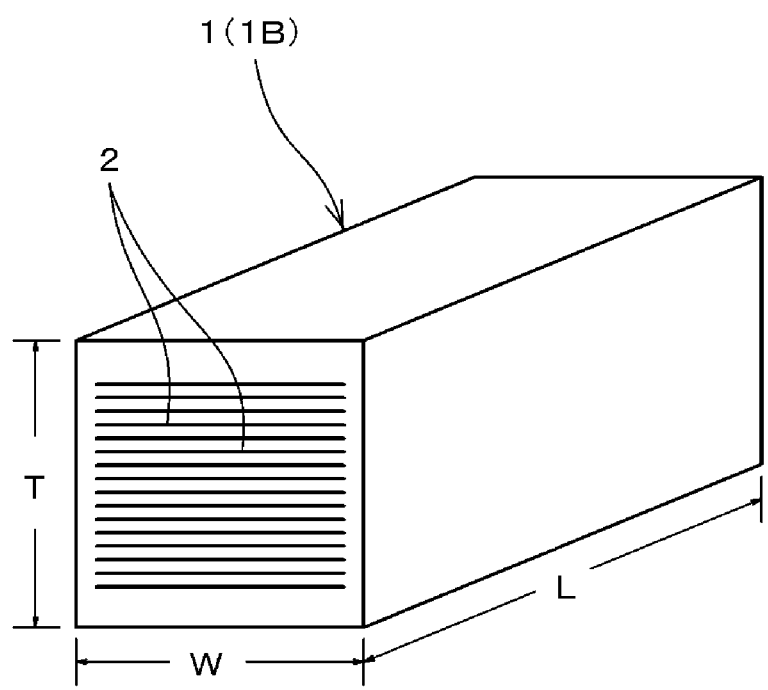
FIG. 10 is a perspective view illustrating one of chips that are to be subjected to a feed operation in a second preferred embodiment of the present invention.

The following chips preferably are prepared as examples of the chips that are used in the second preferred embodiment:

(a) the thin chips 1A each of which has a thickness T of about 0.15 mm, a width W of about 0.5 mm, and a length L of about 1.0 mm as illustrated in FIG. 3; and (b) the thick chips 1B each of which has a rectangular or substantially rectangular columnar shape and each of which has a thickness T of about 0.5 mm, a width W of about 0.5 mm, and a length L of about 1.0 mm as illustrated in FIG. 10.

Figure 11:
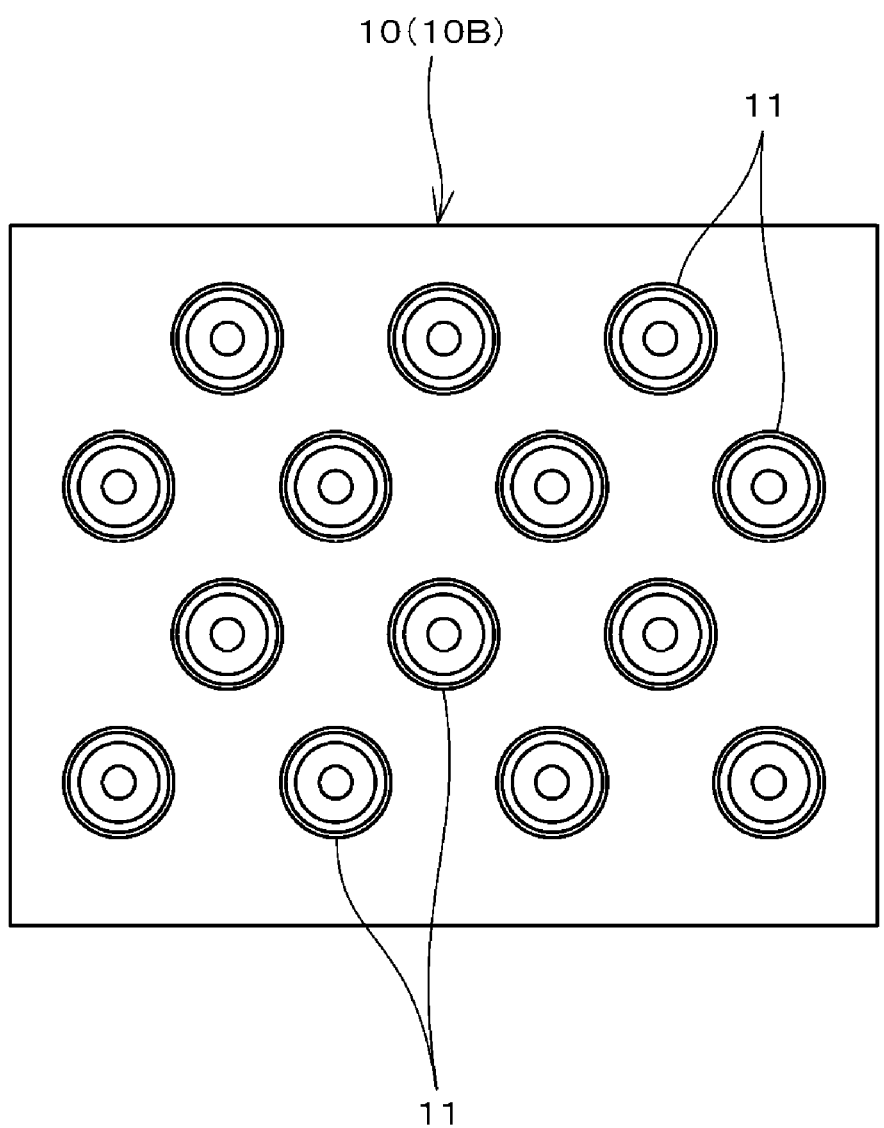
FIG. 11 is a plan view illustrating the configuration of a feed pallet that is used in the second preferred embodiment of the present invention.
Figure 12:
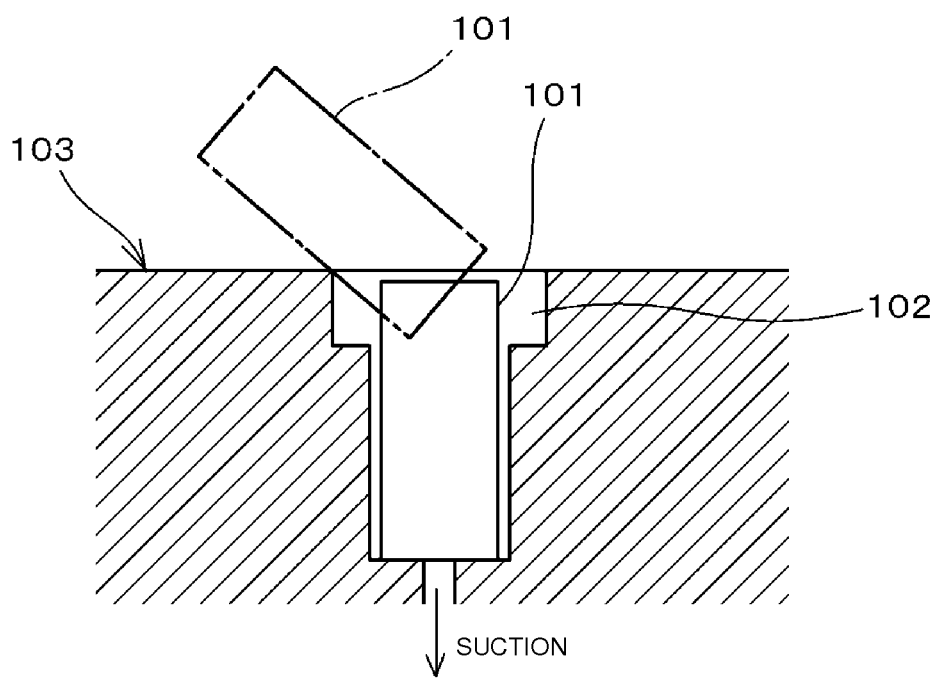
FIG. 12 is a diagram illustrating an alignment method that is performed by a chip alignment apparatus of the related art.
Figure 13:
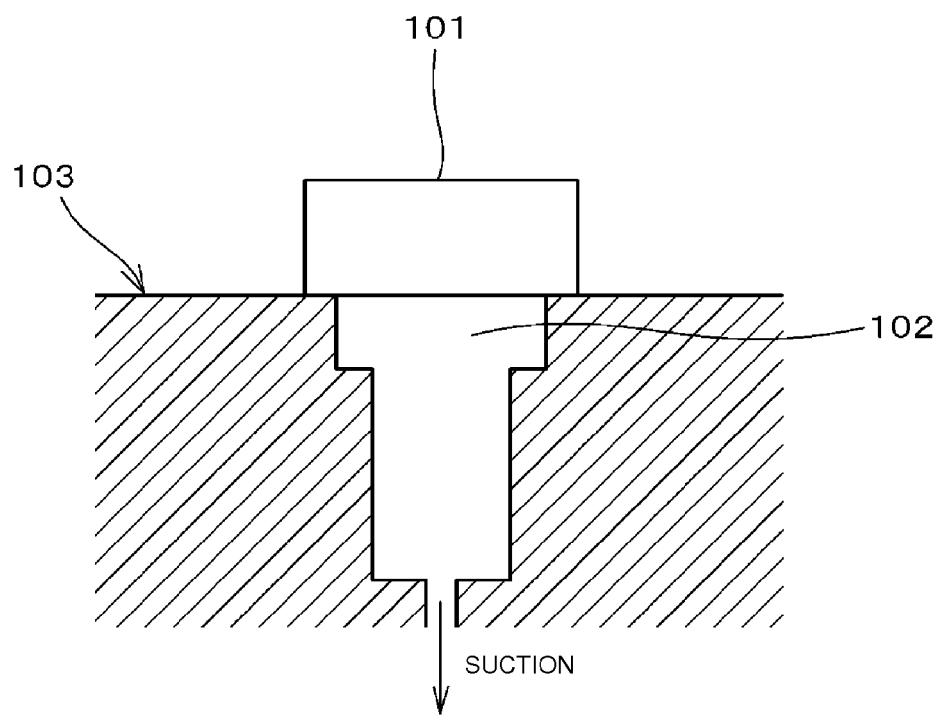
FIG. 13 is a diagram illustrating a problem concerning the chip alignment apparatus of the related art.

The following feed pallets preferably are prepared as the feed pallets that are used in the second preferred embodiment:

(a) the feed pallet 10A that includes, as illustrated in FIG. 2, accommodating portions 11 each of which has a rectangular or substantially rectangular shape that is slightly larger than one of the WT surfaces of one of the chips 1A when viewed in plan and each of which has a depth dimension that is smaller than the length L of the chip 1A by about 0.05 mm to about 0.3 mm, for example; and (b) the feed pallet 10B that includes, as illustrated in FIG. 11, accommodating portions 11 each of which has a circular or substantially circular shape when viewed in plan, each of which has a cylindrical or substantially cylindrical shape having a diameter that is slightly larger than the diagonal dimension of one of the WT surfaces of one of the chips 1B, and each of which has a depth dimension that is smaller than the length L of the chip 1B by about 0.05 mm to about 0.3 mm, for example.

Note that, in both the feed pallet 10A and the feed pallet 10B, a step configured to help the chips 1A or 1B to be fed is provided in the vicinity of an upper opening of each of the accommodating portions 11.

Tests for feeding the above-described thin chips 1A (FIG. 3) and rectangular or substantially rectangular columnar chips 1B (FIG. 10) into the accommodating portions 11 were conducted by using the feed pallets 10A and 10B.

The tests for feeding the chips 1A and 1B into the accommodating portions 11 were conducted under the following conditions. During the period when the tests for feeding the chips 1A and 1B were conducted, vibration was applied under a condition of a rotational speed of a rotary shaft to which a cam was connected of 600 rpm, and suction was performed under each of the following Conditions 1 to 4, and the behavior of the chips 1A and 1B was examined.

Test Conditions (1) Feed Pallets

The above-described feed pallets 10A and 10B were used as feed pallets.

(2) Vibration Conditions

Vibration was applied to the feed pallets 10A and 10B while the rotational speed of the rotary shaft, which had been described in the first preferred embodiment and to which the cam was connected, was set to constantly be 600 rpm (one period per 0.1 seconds).

(3) Suction Conditions

Suction was performed under each of the following Conditions 1 to 4 both in the case of feeding the chips 1A by using the feed pallet 10A and in the case of feeding the chips 1B by using the feed pallet 10B.

Condition 1: Suction was not performed.

Condition 2: Performing suction for 0.5 seconds and stopping suction for 0.5 seconds were alternately performed.

Condition 3: Performing suction for 0.2 seconds and stopping suction for 0.2 seconds were alternately performed.

Condition 4: Performing suction for 0.1 seconds and stopping suction for 0.1 seconds were alternately performed.

Among the above Conditions 1 to 4, in Condition 4, a time when the amplitude is maximum occurs twice in one vibration period, and a negative pressure reaches the maximum range at one of these times.

In the second preferred embodiment, the opening surface area of each of suction ports of the feed pallet 10A preferably was set to be in the range of about 1% to about 30% (preferably specifically about 12%), for example, of the area of one of the WT surfaces of one of the chips 1A, and the opening surface area of each of suction ports of the feed pallet 10B was set to be in the range of about 1% to about 30% (preferably specifically about 12%), for example of the area of one of the WT surfaces of one of the chips 1B.

(4) Length of Time for Feed Operation

In the second preferred embodiment, the length of time over which each of the feed operations, in which suction was intermittently performed while vibration was applied to the feed pallets 10A and 10B, was performed was set to 60 seconds, for example. After the length of time for each of the feed operations had passed, the feed operation was stopped, and the filling percentage, which is the percentage of the accommodating portions 11 into which the chips 1A or 1B had been fed, at that time was checked.

Table 1 shows results (the filling percentage, which is the percentage of the accommodating portions 11 of the feed pallet 10A into which the chips 1A have been fed) of the test for feeding the chips 1A by using the feed pallet 10A under the above conditions.

Table 2 shows results of the test for feeding the chips 1B by using the feed pallet 10B under the above conditions.

TABLE 1

| Conditions | Filling Percentage (%) |
| --- | --- |
| Condition 1 | 1.6 |
| Condition 2 | 37.2 |
| Condition 3 | 57.4 |
| Condition 4 | 90.2 |

TABLE 2

| Conditions | Filling Percentage (%) |
| --- | --- |
| Condition 1 | 88.2 |
| Condition 2 | 90.5 |
| Condition 3 | 95.2 |
| Condition 4 | 99.5 |

As shown in Table 1, in the test for feeding the thin chips 1A by using the feed pallet 10A that includes the accommodating portions 11 each of which has a rectangular or substantially rectangular shape, which is slightly larger than one of the WT surfaces of one of the chips 1A, when viewed in plan, it was confirmed that the filling percentage was about 1.6%, which was extremely low, under Condition 1 in which vacuum suction was not performed. On the other hand, it was confirmed that, under Conditions 2, 3, and 4 in each of which vacuum suction was intermittently performed, the filling percentages were improved and were approximately 37.2%, 57.4%, and 90.2%, respectively, and that particularly good results were obtained under Condition 4.

Note that since the length of time over which each of the feed operations was performed was set to 60 seconds, for example, the absolute value of the filling percentage was not high under Conditions 2 and 3, and a filling percentage of about 90% or more is realized also under Conditions 2 and 3 by properly adjusting the length of time over which each of the feed operations is performed.

As shown in Table 2, in the test for feeding the rectangular or substantially rectangular columnar chips 1B by using the feed pallet 10B that includes the accommodating portions 11 each of which has a circular or substantially circular shape when viewed in plan, and each of which has a shape having a diameter that is slightly larger than the diagonal dimension of one of the WT surfaces of one of the chips 1B, it was confirmed that the filling percentage was about 88.2%, which was low, under Condition 1 in which vacuum suction was not performed. On the other hand, it was confirmed that, under Conditions 2, 3, and 4 in each of which vacuum suction was intermittently performed under the above conditions, the filling percentages were improved and were approximately 90.5%, 95.2%, and 99.5%, respectively, and that particularly good results were able to be obtained under Condition 4.

From the above results, it was confirmed that, according to various preferred embodiments of the present invention, both in the case of feeding the thin chips 1A by using the feed pallet 10A that included the accommodating portions 11 each of which had a rectangular or substantially rectangular shape, which was slightly larger than one of the WT surfaces of one of the chips 1A, when viewed in plan, and in the case of feeding the rectangular or substantially rectangular columnar chips 1B by using the feed pallet 10B that included the accommodating portions 11 each of which had a circular or substantially circular shape when viewed in plan, and each of which had a shape having a diameter that was slightly larger than the diagonal dimension of one of the WT surfaces of one of the chips 1B, the filling percentage, which was the percentage of accommodating portions in which chips had been fed was improved, and the chips were efficiently fed.

Therefore, by using the chip feeder according to various preferred embodiments of the present invention, for example, chips that have been fed can be easily transferred onto an adhesive holding jig with certainty, and a conductive paste that allows formation of outer electrodes is applied on WT surfaces of the chips with certainty by dipping the WT surfaces of the chips, which have been held by the adhesive holding jig, into a conductive paste layer. As a result, electronic components such as chip monolithic ceramic capacitors that include outer electrodes are efficiently manufactured.

Note that, in the above-described preferred embodiments, although the case where chips preferably are ceramic multilayer bodies (monolithic ceramic capacitor elements) that are formed in a process of manufacturing monolithic ceramic capacitors has been described as an example, in the present invention, the types of chips are not particularly limited, and preferred embodiments of the present invention can be widely applied, for example, to the case of feeding chips that are formed in the manufacture of inductors, LC composite components, or the like.

In addition, the present invention is not limited to the above-described preferred embodiments in other respects, and regarding the number of accommodating portions that are provided in a feed pallet, the specific shapes of the accommodating portions, a relationship between the shapes of chips and the shapes of the accommodating portions, and the like, various applications and modifications can be made within the scope of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A chip feeder comprising:
   a feed pallet including an accommodating portion in which a chip is to be accommodated;
   a suction unit configured to perform suction through the accommodating portion and help the chip to be fed into the accommodating portion;
   a vibration application unit configured to apply vibration to the feed pallet; and
   a control unit configured and programmed to periodically switch between a state where suction is being performed by the suction unit through the accommodating portion and a state where suction is not performed in a state where the chip has been supplied on the feed pallet, and where vibration has been applied to the feed pallet by the vibration application unit; wherein
   the chip, which has been supplied on the feed pallet, is fed into the accommodating portion by vibration that is applied to the feed pallet by the vibration application unit and suction that is performed by the suction unit through the accommodating portion;
   the state where suction is being performed and the state where suction is not performed are synchronized with a predetermined period of the vibration; and
   the control unit is configured and programmed to perform control in such a manner that, during one period of the vibration, which is applied to the feed pallet by the vibration application unit, the suction, which is performed by the suction unit through the accommodating portion, is started at least once, and the suction is stopped at least once.

2. The chip feeder according to claim 1, wherein the control unit is configured and programmed to perform control in such a manner that a negative pressure in the accommodating portion that is generated by the suction reaches a maximum range when an amplitude is maximum, and that the negative pressure reaches a minimum range when the amplitude is minimum.

3. The chip feeder according to claim 2, further comprising:
   a sensor configured to detect an amplitude; wherein
   the suction unit is configured to operate at a timing at which the negative pressure reaches a maximum range when the amplitude is maximum.

4. The chip feeder according to claim 1, wherein
   the chip has a rectangular or substantially rectangular parallelepiped shape and is configured to be accommodated in the accommodating portion while, when a thickness, a width, a length of the chip are T, W, and L, respectively, a WT surface that is a surface defined by the thickness T and the width W is facing upward;
   a suction port is provided on a bottom surface of the accommodating portion; and
   an opening area of the suction port is about 1% to about 30% of an area of the WT surface.

5. The chip feeder according to claim 4, wherein the thickness T, the width W, and the length L of the chip have a relationship of $L>W>T$.

6. The chip feeder according to claim 4, wherein the opening area of the suction port is about 12% of the area of the WT surface.

7. The chip feeder according to claim 1, further comprising an oscillation unit configured to cause the feed pallet to oscillate.

8. The chip feeder according to claim 7, wherein the oscillation unit includes an oscillation shaft configured to cause the feed pallet to be inclined at a predetermined angle.

9. The chip feeder according to claim 1, wherein the chip is one of a capacitor, an inductor and a composite component.

10. The chip feeder according to claim 1, wherein the control unit is configured and programmed to control the suction unit to generate a predetermined negative pressure in the accommodating portion at a same time that the vibration unit applies the vibration.

11. The chip feeder according to claim 1, wherein the control unit is configured and programmed to perform synchronous control of the periodic switching between the state where suction is being performed by the suction unit and the state where suction is not performed.

12. The chip feeder according to claim 11, wherein the synchronous control is performed by the control unit based on a signal from a position detection sensor.

13. The chip feeder according to claim 11, wherein the synchronous control is performed by the control unit by setting a vibration period and a switching period of ON and OFF states of suction to a fixed period.

14. The chip feeder according to claim 1, wherein the accommodating portion is one of rectangular, substantially rectangular, circular or substantially circular.

15. The chip feeder according to claim 1, wherein the feed pallet includes a step configured to help the chip to be fed and located at an area of an upper opening of the accommodating portion.

* * * * *